(12) United States Patent
Li et al.

(10) Patent No.: US 12,005,545 B2
(45) Date of Patent: Jun. 11, 2024

(54) FIXING DEVICE AND DETECTION SYSTEM

(71) Applicant: CHANGXIN MEMORY TECHNOLOGIES, INC., Hefei (CN)

(72) Inventors: Chao Li, Hefei (CN); Chin-Chung Ku, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 400 days.

(21) Appl. No.: 17/477,857

(22) Filed: Sep. 17, 2021

(65) Prior Publication Data

US 2022/0152775 A1 May 19, 2022

Related U.S. Application Data

(63) Continuation of application No. PCT/CN2021/106775, filed on Jul. 16, 2021.

(30) Foreign Application Priority Data

Nov. 17, 2020 (CN) .......................... 202011289463.6

(51) Int. Cl.
*B24B 37/20* (2012.01)
*B24B 37/005* (2012.01)
*B24B 37/32* (2012.01)
*H01L 21/67* (2006.01)

(52) U.S. Cl.
CPC .......... *B24B 37/205* (2013.01); *B24B 37/005* (2013.01); *B24B 37/32* (2013.01); *H01L 21/67017* (2013.01); *H01L 21/67253* (2013.01)

(58) Field of Classification Search
CPC ................ B24B 37/205; B24B 37/005; H01L 21/67017; H01L 21/67253
See application file for complete search history.

(56) References Cited

U.S. PATENT DOCUMENTS

| 6,280,306 | B1 | 8/2001 | Hosoki et al. |
| 6,336,846 | B1 | 1/2002 | Park et al. |
| 6,390,908 | B1 | 5/2002 | Gueret |
| 2002/0037693 | A1 | 3/2002 | Lougher et al. |

(Continued)

FOREIGN PATENT DOCUMENTS

| CN | 201455792 U | 5/2010 |
| CN | 201968417 U | 9/2011 |

(Continued)

OTHER PUBLICATIONS

Machine translation of CN 111421439 A, dated May 2020. (Year: 2020).*

(Continued)

*Primary Examiner* — Michael E Barr
*Assistant Examiner* — Kevin G Lee
(74) *Attorney, Agent, or Firm* — Cooper Legal Group, LLC

(57) ABSTRACT

The embodiments of the present application provide a fixing device and a detection system. The fixing device includes: a bearing disk used for bearing a lapping head, the bearing disk being provided with positioning holes and a first positioning ring, the positioning holes being used for accommodating and fixing a positioning pin of a first type of lapping head, and the first positioning ring being used for fixing a positioning disk of a second type of lapping head.

13 Claims, 4 Drawing Sheets

(56) References Cited

U.S. PATENT DOCUMENTS

| | | | |
|---|---|---|---|
| 2003/0194948 A1 | 10/2003 | Metral | |
| 2004/0048553 A1 | 3/2004 | Lee et al. | |
| 2008/0119120 A1 | 5/2008 | Zuniga et al. | |
| 2008/0293339 A1 | 11/2008 | Huang et al. | |
| 2016/0129547 A1* | 5/2016 | Duescher | B24B 37/20 451/259 |
| 2017/0291276 A1 | 10/2017 | Sun | |

FOREIGN PATENT DOCUMENTS

| | | |
|---|---|---|
| CN | 202057293 U | 11/2011 |
| CN | 202473871 U | 10/2012 |
| CN | 104677315 A | 6/2015 |
| CN | 107199503 A | 9/2017 |
| CN | 208696736 U | 4/2019 |
| CN | 110545958 A | 12/2019 |
| CN | 111421439 A | 7/2020 |
| CN | 210968417 U | 7/2020 |
| CN | 111687746 A | 9/2020 |
| CN | 111745533 A | 10/2020 |
| JP | 2014000647 A | 1/2014 |
| KR | 20150086865 A | 7/2015 |
| KR | 20200031955 A | 3/2020 |
| TW | 466151 B | 12/2001 |
| TW | 200300721 A | 6/2003 |
| WO | 0187541 A2 | 11/2001 |

OTHER PUBLICATIONS

Machine translation of CN202057293U, dated Nov. 2011. (Year: 2011).*

Wang, et al., "Research and Implementation on Critical Technology of Chemical Mechanical Polishing Tool for 300 mm Wafer", vol. 50, No. 5, Mar. 2014, 6 pages with English Abstract.

Corresponding PCT Patent Application No. PCT/CN2021/106775, International Search Report dated Oct. 27, 2021.

* cited by examiner

FIXING DEVICE AND DETECTION SYSTEM

CROSS-REFERENCE TO RELATED APPLICATIONS

This is a continuation application of International Patent Application No. PCT/CN2021/106775, filed on Jul. 16, 2021, which claims priority to Chinese Patent Application No. 202011289463.6, filed on Nov. 17, 2020 and titled "FIXING DEVICE AND DETECTION SYSTEM". International Patent Application No. PCT/CN2021/106775 and Chinese Patent Application No. 202011289463.6 are incorporated into the present application by reference in their entireties.

TECHNICAL FIELD

Embodiments of the present application relate to the field of semiconductors, and in particular, to a fixing device and a detection system.

BACKGROUND

Chemical mechanical polishing (CMP) is a process flow which completely planarizes a wafer with the combination of a lapping pad for rubbing and a lapping fluid for chemical reaction by sucking the wafer onto a lapping head and pressing the wafer against the lapping pad.

A retaining ring of the lapping head will be abraded in the process of wafer lapping, and the abrasion of the retaining ring will affect the surface profile and surface particle size of the wafer. Therefore, it is particularly important to monitor the retaining ring.

SUMMARY

Embodiments of the present application provide a fixing device and a detection system.

An embodiment of the present application provides a fixing device, which includes: a bearing disk used for bearing a lapping head, the bearing disk being provided with positioning holes and a first positioning ring, the positioning holes being used for accommodating and fixing a positioning pin of a first type of lapping head, and the first positioning ring being used for fixing a positioning disk of a second type of lapping head.

Correspondingly, an embodiment of the present application further provides a detection system, which includes: the fixing device according to the above; and a detector, used for detecting surface characteristic parameters of a lapping head.

BRIEF DESCRIPTION OF DRAWINGS

Exemplary descriptions will be made for one or more embodiments with reference to the pictures in the corresponding accompanying drawings without constituting a limitation to the embodiments. Elements with the same reference numerals in the accompanying drawings are represented as similar elements, and unless stated otherwise, the pictures in the accompanying drawings do not constitute a scale limitation.

DESCRIPTION OF EMBODIMENTS

In a prior art, it is only believed that surface profiles and surface particle sizes of wafer products are presented differently at the early, middle and late phases of the service life of a lapping head, and it is believed that the differences between the early, middle and late phases of the lapping head only lie in the change in abrasion loss of a retaining ring on the lapping head and that the change in abrasion loss is only reflected in the change in groove depth of the retaining ring. Therefore, workers usually only use a vernier caliper to simply measure a groove depth of the retaining ring in actual production.

The defects in using a vernier caliper to measure a groove depth are as follows: firstly, a top curve of the retaining ring cannot be measured; secondly, an error of measured data is excessive, and the retaining ring can be easily injured.

In order to solve the aforementioned problems, an embodiment of the present application provides a fixing device, which includes a bearing disk with positioning holes and a first positioning ring. The bearing disk can be used for fixing multiple types of lapping heads provided with a positioning pin or a positioning disk. That is, the fixing device is not required to be replaced when fixing different types of lapping heads. Thus, a detector can be disposed around the fixing device to perform accurate detection on multiple types of lapping heads fixed by the fixing device.

In order to make the object, technical solution and advantages of the embodiments of the present application clearer, each embodiment of the present application will be set forth in detail hereinafter with reference to the accompanying drawings. However, those of ordinary skill in the art can understand that many technical details are put forward in each embodiment of the present application in order for readers to better understand the present application. However, even without these technical details and various changes and modifications based on the following embodiments, the technical solution which is required to be protected by the present application can still be implemented.

Figure 1:
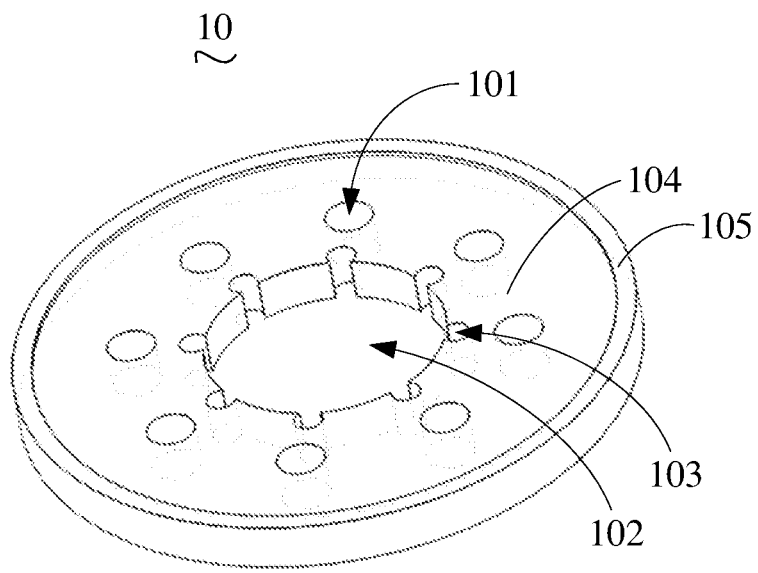
FIG. 1 is a schematic structural diagram of a fixing device according to an embodiment of the present application.
Figure 2:
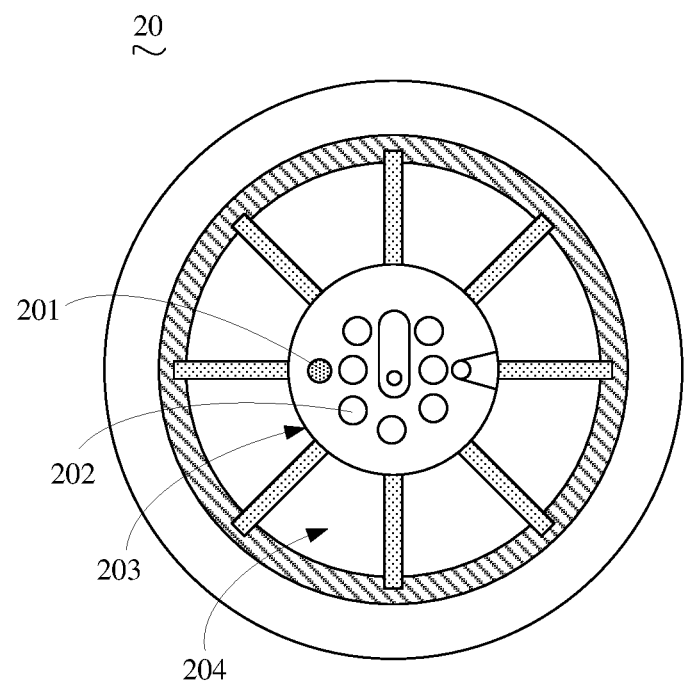
FIG. 2 is a front view of a first type of lapping head according to an embodiment of the present application.
Figure 3:
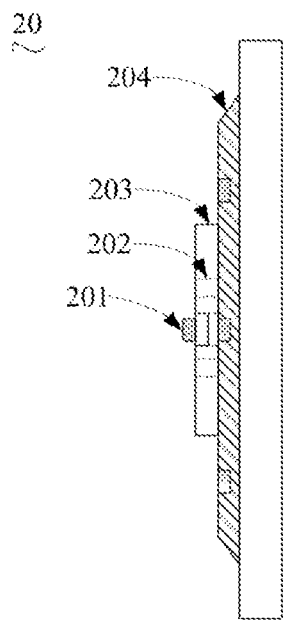
FIG. 3 is a right view of the first type of lapping head according to an embodiment of the present application shown in FIG. 2.
Figure 4:
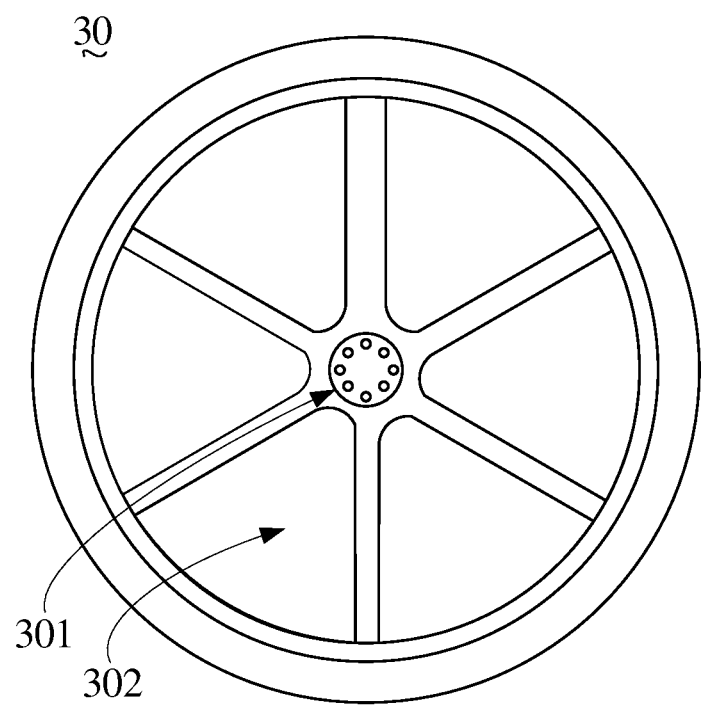
FIG. 4 is a front view of a second type of lapping head according to an embodiment of the present application.

FIG. 1 is a schematic structural diagram of a fixing device according to an embodiment of the present application; FIG. 2 is a front view of a first type of lapping head; FIG. 3 is a right view of the first type of lapping head shown in FIG. 2; and FIG. 4 is a front view of a second type of lapping head.

In the present embodiment, the fixing device includes: a bearing disk 10 used for bearing a lapping head, the bearing disk 10 being provided with positioning holes 101 and a first positioning ring 102, the positioning holes 101 being used for accommodating and fixing a positioning pin 201 of a first type of lapping head 20, and the first positioning ring 102 being used for fixing a positioning disk of a second type of lapping head 30.

Since both the first type of lapping head 20 and the second type of lapping head 30 are provided with positioning disks, for concise expression, a first positioning disk 203 is adopted to represent the positioning disk on the first type of lapping head 20, and a second positioning disk 301 is adopted to represent the positioning disk on the second type of lapping head 30.

Moreover, it should be noted that the first type of lapping head 20 including the positioning pin 201 shown in FIG. 2 is merely an exemplary description herein, and other types of lapping heads with a positioning pin may also serve as the first type of lapping head herein. Likewise, the second type of lapping head 30 including the second positioning disk 301 shown in FIG. 4 is merely an exemplary description herein, and other types of lapping heads with positioning disks may also serve as the second type of lapping head herein. According to different types of lapping heads to be fixed, the specific size of the fixing device proposed herein can be adjusted.

Hereinafter, the first type of lapping head 20 and the second type of lapping head 30 will be described correspondingly first, and then the implementations of the embodiments of the present application will be set forth through the first type of lapping head 20 and the second type of lapping head 30.

Referring to FIG. 2 and FIG. 3, the first type of lapping head 20 is provided with a first positioning disk 203, vent holes 202 running through the first positioning disk 203 and a positioning pin 201 projected from the first positioning disk 203. The first positioning disk 203 is located on the back of the first type of lapping head 20, and a pressing head and a retaining ring are located on the front of the first type of lapping head 20. The vent holes 202 are arranged around a center of the first positioning disk 203. A fixing surface between the positioning pin 201 and the first positioning disk 203 is located on a path from the center to an edge of the first positioning disk 203, i.e., located between the center and the edge of the first positioning disk 203. In addition, the first type of lapping head 20 is further provided with a first base disk 204. The first positioning disk 203 is projected relative to the first base disk 204. From the surface of the first base disk 204 facing the first positioning disk 203, the first positioning disk 203 has a first projected height.

Referring to FIG. 4, the back of the second type of lapping head 30 is provided with a second positioning disk 301 and a second base disk 302. In a direction away from the back of the second type of lapping head 30, the second positioning disk 301 is projected relative to the second base disk 302, with a projected height of the second positioning disk 301 being a second projected height.

In the present embodiment, both the first positioning disk 203 and the second positioning disk 301 are shaped like a circle, and a diameter of the second positioning disk 301 is less than a diameter of the first positioning disk 203. For example, the diameter of the first positioning disk 203 is 120 mm, and the diameter of the second positioning disk 301 is 50 mm. In other embodiments, the first positioning disk and the second positioning disk may also be shaped like a triangle, a hexagon, an ellipse or other shapes, and the shapes of the first positioning disk and the second positioning disk may be different.

For the positioning pin 201 and the second positioning disk 301, the bearing disk 10 according to the embodiment of the present application is provided with the positioning holes 101 and the first positioning ring 102, with the positioning holes 101 being used for accommodating and fixing the positioning pin 201 and the first positioning ring 102 being used for accommodating and fixing the second positioning disk 301, and corresponding tolerance fits may be set between the positioning holes 101 and the positioning pin 201 and between the first positioning ring 102 and the second positioning disk 301 as actually required. For example, a diameter of the first positioning ring 102 is 50 mm.

In the present embodiment, the positioning holes 101 and the first positioning ring 102 are through holes running through the bearing disk 10. In other embodiments, the positioning holes and the first positioning ring are blind holes.

Arranging the positioning holes 101 and the first positioning ring 102 as through holes has the following three advantages:
firstly, machining is simple, and only a sectional dimension of the positioning pin 201 is required to be considered in actual machining, without considering a height of the positioning pin 201;
secondly, since the height of the positioning pin 201 is not required to be considered and the positioning pin 201 can pass through the positioning hole 101, a thin bearing disk 10 may be disposed, that is, a depth of the positioning hole 101 may be less than the height of the positioning pin 201 in a direction perpendicular to the surface of the bearing disk 10, helping to save materials and reduce costs as well as to reduce a weight of the bearing disk 10 and decrease the supporting requirement of the bearing disk 10; and
thirdly, surface fitting is ensured. For example, by arranging the through holes for accommodation and fixing, when an actual height of the positioning pin 201 is greater than a preset height, a surface of the first positioning disk 203 can still fit a surface of the bearing disk 10, and when an actual thickness of the second positioning disk 301 is greater than a preset thickness, it can be ensured that a surface of the second base disk 302 can fit the surface of the bearing disk 10. Thus, a large contact area can be ensured between the bearing disk 10 and the lapping head, ensuring that the lapping head is uniformly borne and that the lapping head is located at a preset position, i.e., ensuring the bearing precision of the lapping head.

In the present embodiment, the bearing disk 10 includes the first positioning ring 102 located at the center and a plurality of positioning holes 101 surrounding the first positioning ring 102. Thus, the first type of lapping head 20 with different rotation angles can be fixed without an extra rotation step, or a lapping head with a plurality of positioning pins can be fixed, with the plurality of positioning pins being used for preventing the rotation of the lapping head.

In the present embodiment, the distances between the plurality of positioning holes 101 and a center of the first positioning ring 102 are equal. In other embodiments, the distances between at least two of the plurality of positioning holes and the center of the first positioning ring are different, so that multiple types of lapping heads with positioning pins at different positions can be fixed, that is, a bearing range of the bearing disk can be expanded.

In the present embodiment, the bearing disk 10 further includes gas passage holes 103, which are used for being communicated with the vent holes 202 of the first type of lapping head 20 to convey a released gas of the first type of lapping head 20. For example, when borne on the bearing disk 10, the first type of lapping head 20 may squeeze out an internal gas due to its own weight, and the gas which has been squeezed out is released out via the vent holes 202. The arrangement of the gas passage holes 103 helps to ensure that the internal gas of the first type of lapping head 20 can be completely released, avoiding the ineffectiveness of subsequent detection as a result of different gas release degrees of the first type of lapping head 20, and avoiding the position change (e.g., inclination) of the first type of lapping head 20 as a result of the presence of the internal gas failing to be released normally between the first type of lapping head 20 and the bearing disk 10 to ensure the positional precision of the lapping head located on the bearing disk 10.

In the present embodiment, the first positioning ring 102 is a via hole running through the bearing disk 10 and the gas passage holes 103 are partially superposed with the first positioning ring 102, thus helping to accelerate the release of the internal gas of the first type of lapping head 20, increasing a positioning rate of the first type of lapping head 20. In other embodiments, the first positioning ring serves as a gas passage hole for releasing gas, thus helping to further simplify the structure of the bearing disk, decreasing the difficulty in preparing the bearing disk.

In addition, arranging the gas passage holes 103 to be partially superposed with the first positioning ring 102 also helps to avoid the defect present in the gas passage holes 103; i.e., when the actually formed gas passage holes 103 are blind holes or gas outlets of the actually formed gas passage holes 103 are small in area, gas cannot be effectively released. That is, the partial superposition between the gas passage holes 103 and the first positioning ring 102 helps to ensure the normal release of the internal gas of the first type of lapping head 20.

In the present embodiment, the bearing disk 10 includes a plurality of gas passage holes 103 surrounding the first positioning ring 102, which may be arranged corresponding to the positions of the vent holes 202 of the first type of lapping head 20 to ensure the uniform release of the internal gas. In one example, the size of the gas passage hole 103 may also be greater than that of the vent hole 202 to ensure that when an assembly deviation of the bearing disk 10 and the first type of lapping head 20 occurs, every gas passage hole 103 receives a same amount of gas and a flow rate of the gas in every gas passage hole 103 is close, i.e., further ensuring the uniformity of the release of the internal gas.

In the present embodiment, the bearing disk 10 includes a bearing plate 104 and a second positioning ring 105 surrounding an outer edge of the bearing plate 104. The positioning holes 101 and the first positioning ring 102 are located in the bearing plate 104. The first type of lapping head 20 is provided with the first positioning disk 203 for fixing the positioning pin 201, and the second positioning ring 105 is used for accommodating and fixing the first positioning disk 203. That is, an internal diameter of the second positioning ring 105 and a diameter of the first positioning disk 203 are equal or matched according to a tolerance.

In the present embodiment, the second projected height of the second positioning disk 301 is greater than a height difference between a top surface of the second positioning ring 105 and a top surface of the bearing plate 104. Thus, it can be ensured that when the surface of the second base disk 302 comes into contact with the top surface of the second positioning ring 105, the second positioning disk 301 is accommodated and fixed by the first positioning ring 102, ensuring that the second type of lapping head 30 is fixed well. The height difference between the top surface of the second positioning ring 105 and the top surface of the bearing plate 104 may be 1 mm.

In addition, the first projected height of the first positioning disk 203 is greater than or equal to the height difference between the top surface of the second positioning ring 105 and the top surface of the bearing plate 104, ensuring that the surface of the first positioning disk 203 can come into contact with the surface of the bearing plate 104 and that the surface of the first base disk 204 is higher than or flushed with the top surface of the second positioning ring 105.

Figure 5:
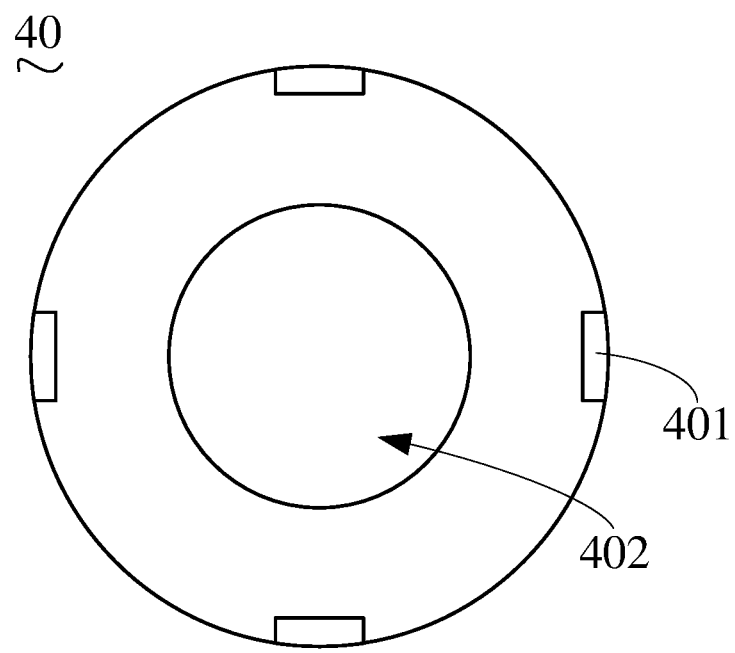
FIG. 5 is a front view of a datum ring according to an embodiment of the present application.
Figure 6:
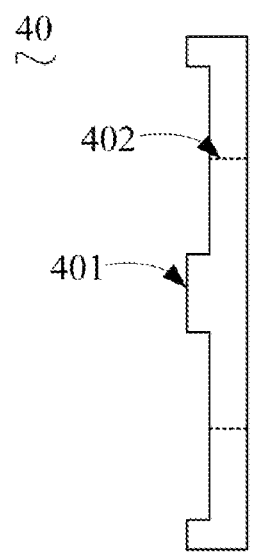
FIG. 6 is a right view of the datum ring according to an embodiment of the present application shown in FIG. 5.

In the present embodiment, the fixing device further includes: a datum ring 40 and a moving unit (not shown in the drawings). Referring to FIG. 5 and FIG. 6, a top surface of the datum ring 40 serves as a datum plane 401, and an internal diameter of the datum ring 40 is less than external diameters of the first type of lapping head 20 and the second type of lapping head 30. The moving unit is used for controlling the bearing disk 10 to move up or down along a first central axis of the datum ring 40.

For example, an external diameter of the bearing disk 10 is less than or equal to the internal diameter of the datum ring 40, and the moving unit can fix the bearing disk 10 and control the bearing disk 10 to move in a central hole 402 of the datum ring 40. In addition, the first central axis is a central axis which is perpendicular to a plane where the datum ring 40 is located, and moving up or down along the first central axis can ensure that the lapping head (including the first type of lapping head 20 and the second type of lapping head 30) with an external diameter greater than the internal diameter of the datum ring 40 borne by the bearing disk 10 can be steadily placed on the datum plane 401 of the datum ring 40.

In one example, the steps of controlling the lapping head to be steadily placed on the datum plane 401 include: the moving unit pushing up the bearing disk 10 to upwardly pass through the central hole 402 of the datum ring 40; fixing the first type of lapping head 20 or the second type of lapping head 30 on the bearing disk 10; and the moving unit then moving downward to make the bearing disk 10 downwardly pass through the central hole 402. Since the external diameter of the first type of lapping head 20 or the second type of lapping head 30 is greater than that of the datum ring 40, the first type of lapping head 20 or the second type of lapping head 30 can be borne on the datum plane 401, i.e., making the lapping head be located at a preset position, so as to perform subsequent detection and help to ensure the detection precision of the subsequent detection.

In the present embodiment, the moving unit can also control the lapping head to rotate in order to allow a region detector to detect the whole lapping head. In other embodiments, the lapping head may be manually controlled to rotate.

In the present embodiment, with the positioning holes and the first positioning ring, the bearing disk can be used for fixing multiple types of lapping heads provided with a positioning pin or a positioning disk. That is, the fixing device is not required to be replaced when fixing different types of lapping heads. Thus, auxiliary devices can be disposed around the fixing device to perform detection on multiple types of lapping heads fixed by the fixing device and other steps.

Correspondingly, an embodiment of the present application further provides a detection system, which includes: the fixing device according to any of the above; and a detector used for detecting surface characteristic parameters of a lapping head.

Figure 7:
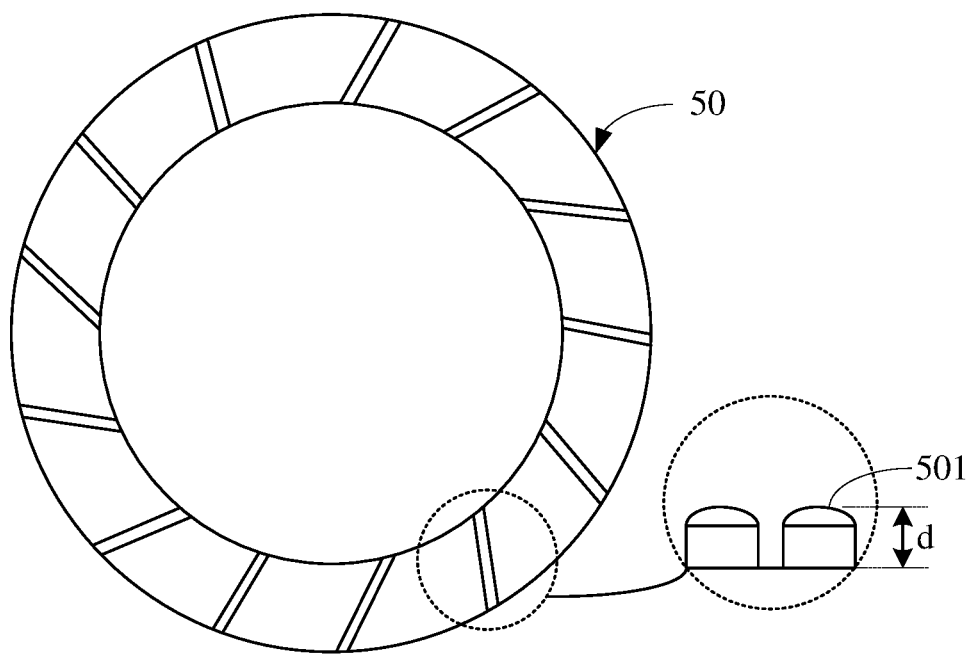
FIG. 7 is a schematic structural diagram of a lapping head according to an embodiment of the present application.

Referring to FIG. 7, the surface characteristic parameters include a surface curve 501 and a groove depth d of a retaining ring 50 of the lapping head.

In the present embodiment, the detector is used for locally detecting the retaining ring 50. If global detection is required, then the retaining ring 50 is required to be rotated manually or by the moving unit, or a global detector is required to be used.

For example, the detector may be a laser detector. Since the laser detector has a distance requirement, that is, the laser detector has an optimal detection precision when the laser detector is at a preset distance from the lapping head, a datum plane can be arranged, so that the lapping head to be detected is located on the datum plane, thereby ensuring a high detection precision of the laser detector. Moreover, when the laser detector is used for detection, non-contact detection can be carried out, which helps to ensure that the retaining ring 50 has a good surface.

In the present embodiment, the detector further includes an analyzer (not shown in the drawings) used for analyzing a service life of the retaining ring 50 according to surface curves 501 and groove depths d of the retaining ring 50 at different times and according to characteristic parameters of wafers formed by using the same lapping head at different times. Characteristic dimensions of a wafer include a surface profile and surface particle size of the wafer.

In one example, after acquiring the surface curves 501 of the retaining ring 50 at different times and the characteristic parameters of the wafers formed at different times, the analyzer analyzes out a formation time of a wafer with optimal characteristic parameters, and then acquires a surface curve 501 of the retaining ring 50 at the corresponding time, and thereby, the surface curve 501 at this time can be considered as an optimal curve of the retaining ring 50. Adopting the optimal curve as an initial surface curve of the retaining ring 50 can help to increase the quality of the wafer formed at an initial time.

In addition, after acquiring the groove depths d of the retaining ring 50 at different times and the characteristic parameters of the wafers formed at different times, the analyzer analyzes out formation times of the wafers failing to meet characteristic parameter requirements, and then acquires a groove depth d of the retaining ring 50 at the corresponding time, and thereby, the groove depth d at this time can be considered as a minimum effective groove depth of the retaining ring 50, that is, the retaining ring 50 should be replaced when the groove depth d of the retaining ring 50 is less than the minimum effective groove depth. Thus, a minimum effective groove depth and actual effective life of the retaining ring 50 can be obtained, preventing the retaining ring 50 from being replaced ahead of time, reducing cost.

The characteristic parameters of the wafer further include whether the wafer slips. When the wafer slips, it indicates that the retaining ring 50 can no longer limit the position of the wafer, and at this point, the retaining ring 50 should be replaced.

An embodiment of the present application provides a detection system, which can be used for effectively detecting multiple types of lapping heads.

Those of ordinary skill in the art should understand that the aforementioned embodiments are the specific embodiments implementing the present application. However, in practical application, various changes can be made to the embodiments in terms of forms and details without departing from the spirit and scope of the present application. Any person skilled in the art can make respective alterations and modifications without departing from the spirit and scope of the present application, so the protection scope of the present application should be subject to the scope defined by the claims.

What is claimed is:

1. A fixing device, comprising:
a bearing disk, used for bearing a lapping head, the bearing disk being provided with positioning holes and a first positioning ring, the positioning holes being used for accommodating and fixing a positioning pin of a first type of lapping head, and the first positioning ring being used for fixing a positioning disk of a second type of lapping head;
wherein the bearing disk comprises a bearing plate and a second positioning ring surrounding an outer edge of the bearing plate, with the positioning holes and the first positioning ring being located in the bearing plate, the first type of lapping head is provided with a positioning disk used for fixing the positioning pin, and the second positioning ring is used for accommodating and fixing the positioning disk of the first type of lapping head.

2. The fixing device according to claim 1, wherein the positioning disk of the second type of lapping head has a second projected height, and in a direction perpendicular to a surface of the bearing disk, a height difference between a top surface of the second positioning ring and a top surface of the bearing plate is less than the second projected height.

3. The fixing device according to claim 1, further comprising: a datum ring and a moving unit, a top surface of the datum ring being a datum plane, an internal diameter of the datum ring being less than external diameters of the first type of lapping head and the second type of lapping head, and the moving unit being used for controlling the bearing disk to move up or down along a first central axis of the datum ring.

4. A detection system, comprising:
the fixing device according to claim 1; and
a detector used for detecting surface characteristic parameters of the lapping head.

5. The detection system according to claim 4, wherein the surface characteristic parameters comprise a surface curve and a groove depth of a retaining ring of the lapping head.

6. The detection system according to claim 5, further comprising: an analyzer used for analyzing a service life of the retaining ring according to surface curves and groove depths of the retaining ring at different times and according to characteristic parameters of wafers formed by using a same lapping head at different times.

7. The fixing device according to claim 1, wherein the bearing disk comprises the first positioning ring located at a center and the positioning holes surrounding the first positioning ring.

8. The fixing device according to claim 7, wherein the bearing disk further comprises gas passage holes used for being communicated with vent holes of the first type of lapping head to convey a released gas of the first type of lapping head.

9. The fixing device according to claim 8, wherein the first positioning ring is a through hole running through the bearing disk, and the gas passage holes are partially superposed with the first positioning ring.

10. The fixing device according to claim 8, wherein a size of each of the gas passage holes is greater than that of the vent holes.

11. A detection system, comprising:
the fixing device according to claim 7; and
a detector used for detecting surface characteristic parameters of the lapping head.

12. The detection system according to claim 11, wherein the surface characteristic parameters comprise a surface curve and a groove depth of a retaining ring of the lapping head.

13. The detection system according to claim 12, further comprising: an analyzer used for analyzing a service life of the retaining ring according to surface curves and groove depths of the retaining ring at different times and according to characteristic parameters of wafers formed by using a same lapping head at different times.

* * * * *